United States Patent [19]
Ozawa

[11] Patent Number: 6,154,270
[45] Date of Patent: Nov. 28, 2000

[54] SCANNING EXPOSURE METHOD AND APPARATUS

[75] Inventor: Ken Ozawa, Tokyo, Japan

[73] Assignee: Nikon Corporation, Tokyo, Japan

[21] Appl. No.: 09/356,447

[22] Filed: Jul. 19, 1999

Related U.S. Application Data

[60] Continuation of application No. 08/958,910, Oct. 28, 1997, abandoned, which is a division of application No. 08/565,863, Dec. 1, 1995, Pat. No. 5,728,495.

[30]      Foreign Application Priority Data

Mar. 15, 1995   [JP]   Japan ..................................... 7-055399

[51] Int. Cl.[7] ........................... G03B 27/42; G03B 27/74; G03B 27/54; G03B 27/72
[52] U.S. Cl. ................................ 355/53; 355/67; 355/68; 355/71
[58] Field of Search ................................. 355/53, 67, 77, 355/68, 69, 71; 250/492.2, 492.22; 356/399, 400

[56]          References Cited

U.S. PATENT DOCUMENTS

| | | | |
|---|---|---|---|
| 4,624,551 | 11/1986 | Anzai et al. ................................ | 355/53 |
| 4,712,910 | 12/1987 | Sakato ........................................ | 355/53 |
| 4,924,257 | 5/1990 | Jain ............................................ | 355/53 |
| 4,970,546 | 11/1990 | Suzuki et al. .............................. | 355/53 |
| 5,097,291 | 3/1992 | Suzuki ....................................... | 355/69 |
| 5,191,374 | 3/1993 | Hazama et al. ............................ | 355/43 |
| 5,194,893 | 3/1993 | Nishi .......................................... | 355/53 |
| 5,250,797 | 10/1993 | Sano et al. ............................... | 250/205 |
| 5,491,534 | 2/1996 | Shiozawa ................................... | 355/69 |
| 5,526,093 | 6/1996 | Takahashi .................................. | 355/53 |
| 5,627,627 | 5/1997 | Suzuki ....................................... | 355/68 |
| 5,644,383 | 7/1997 | Mori .......................................... | 355/68 |
| 5,721,608 | 2/1998 | Tanigichi ................................... | 355/53 |

*Primary Examiner*—Russell Adams
*Assistant Examiner*—Hung Henry Nguyen
*Attorney, Agent, or Firm*—Vorys, Sater, Seymour and Pease LLP

[57]          ABSTRACT

A scanning exposure method is arranged to illuminate a mask with light pulses and to synchronously scan the mask and a photosensitive substrate so as to effect scanning exposure of a pattern image of the mask on the photosensitive substrate, and includes detecting energy amounts of light pulses illuminating the mask during the scanning exposure, successively calculating an integrated amount of light of the last N pulses (N is an integer more than one) for every unit pulse number, based on the energy amounts thus detected and adjusting an exposure dose on the photosensitive substrate in accordance with a sequence of integrated amounts of light thus calculated.

38 Claims, 5 Drawing Sheets

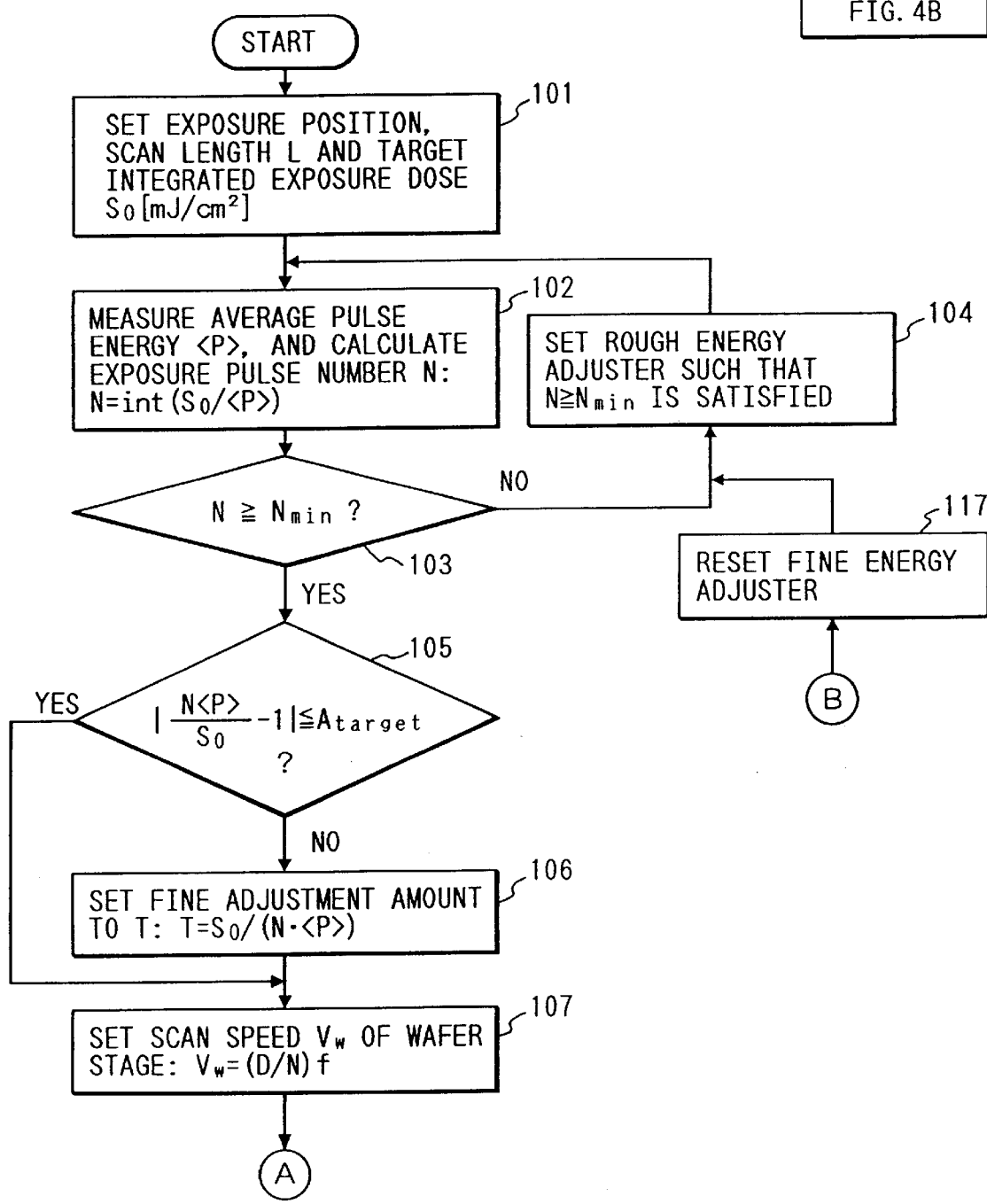

SCANNING EXPOSURE METHOD AND APPARATUS

CROSS-REFERENCE TO RELATED APPLICATIONS

This application is a continuation of application Ser. No. 08/958,910 filed Oct. 28, 1997, abandoned, which is a division of application Ser. No. 08/565,863 filed Dec. 1, 1995, now U.S. Pat. No. 5,728,495.

BACKGROUND OF THE INVENTION

1. Field of the Invention

The present invention relates to a scanning exposure apparatus of the so-called slit scan method or step-and-scan method, or the like for continuously exposure-printing patterns formed on a mask onto a photosensitive substrate by illuminating, for example, a rectangular or arcuate illumination area with exposure light and synchronously scanning the mask and photosensitive substrate relative to the illumination area.

2. Related Background Art

Projection exposure apparatus, which are arranged to project (or expose) an image of patterns of a reticle as a mask through a projection optical system onto a wafer (or glass plate, etc.) coated with a photoresist or the like, have been used heretofore in fabricating, e.g. semiconductor devices, liquid crystal displays, image pickup devices (CCDs etc.) and magnetic thin-film heads, by the photolithography techniques. One of basic functions of such projection exposure apparatus is an exposure dose controlling function to maintain an exposure dose (integral exposure energy) at each point in each shot area of wafer within a proper range.

Another demand these days is to further enhance the resolution of patterns printed on the wafer. One of the techniques for enhancing the resolution is to decrease the wavelength of exposure light. Concerning this, light sources that can emit light of short wavelengths, among those presently available as an exposure light source, are laser light sources of the pulse oscillation type (pulsed light sources), for example excimer laser light sources such as a KrF excimer laser or an ArF excimer laser, metal vapor laser light sources, or YAG laser light sources. The pulsed light sources, however, have different characteristics from light sources of a continuous emission type such as a mercury lamp: exposure energy (pulse energy) of pulsed light emitted from the pulsed light source is dispersed within a certain range pulse by pulse. Thus, the dispersion in pulse energy needs to be taken into account for control of exposure dose in the use of the pulsed light source.

When such a pulsed light source is applied to a projection exposure apparatus of a one-shot exposure type such as a stepper, a known control of exposure dose is the so-called cut-off control, in which a so-called integrator sensor is used for continuously monitoring the light amount of exposure light and in which emission from the pulsed light source is repeated until a result of the measurement by the integrator sensor exceeds a specific, critical level determined by taking into account the dispersion in pulse energy with respect to a target exposure dose. Further, another known control is the so-called pulse-by-pulse control, in which the pulse energy is adjusted for every emission of pulse in accordance with the result of measurement by the integrator sensor. This pulse-by-pulse control can decrease a minimum number of exposure pulses per point on the wafer to a number smaller than that in the cut-off control.

Meanwhile, in recent years, the size of one chip of, e.g., a semiconductor device has increased and the projection exposure apparatus has been required to increase the exposure area so as to project patterns with a larger area on the reticle onto the wafer. However, simply increasing an exposure field of projection optical system for that purpose would result in increasing the production cost, because the projection optical system becomes complex in order to keep aberrations within an acceptable range over the entire surface of the wide exposure field, and would result in increasing the scale of the projection optical system, which would in turn increase the size of the entire apparatus too much. Thus, in order to meet the demand to increase the area of transferred patterns while not increasing the size of the exposure field of projection optical system too much, a projection exposure apparatus of the so-called slit scan type, has been developed which is arranged to continuously exposure-print the patterns on the reticle onto the wafer by synchronously scanning the reticle and wafer relative to an illumination area, for example, of a rectangular, arcuate, hexagonal, or another shape (hereinafter referred to as a "slit illumination area"). When exposures are effected on many of shot areas each by the slit scan method, a stepping method is employed for movement between shot areas. The exposure method of this type is thus called a step-and-scan method.

The aforementioned cut-off control cannot be applied to the control of exposure dose in the projection exposure apparatus employing the above scanning exposure method and the pulsed light source, because exposure is continuously performed. The pulse-by-pulse control requires a complex algorithm. Here is explained with an example of a so-called pulse count method for exposing all points on the wafer with a same number of pulses, as the simplest control method of exposure dose in the case of the scanning exposure method. In this pulse count method, an average of present pulse energy is measured before exposure, an energy modulator in an illumination optical system modulates an exposure dose of pulse energy, based on a result of the measurement, and then scanning exposure is effected so as to keep the number of irradiation pulses constant for every point on the wafer.

A precondition for the control of exposure dose in the conventional scanning exposure method as described above is that the average of pulse energy initially measured is invariant during scanning exposure. It is, however, known that the average of pulse energy of pulsed light output from the pulsed light source varies in the middle or long term, for example during a process of transfer from a certain shot area to a next shot area or during a process of transfer from a certain wafer to a next wafer, though the pulsed light source is normally stabilized by a stabilizing method of emission energy by voltage control of high-voltage power supply.

Accordingly, when the control of exposure dose by the pulse count method was carried out in the projection exposure apparatus of the scanning exposure type using the pulsed light source as an exposure light source, there was a problem that a difference could be made in the average of exposure doses at respective points in a shot area between shot areas or between wafers, thus leaving a possibility that some shot areas were exposed by an exposure dose over a permissible dose.

The above description concerned the cases using the pulsed light source. Similarly, even in the cases of performing exposure by the scanning exposure method using continuous light such as bright lines of the mercury lamp (the i-line etc.), the conventional control method had a possibility that a certain shot area on the wafer was exposed by an exposure dose exceeding the permissible dose because of a change in light amount of the continuous light.

SUMMARY OF THE INVENTION

Under the above circumstances, an object of the present invention is to provide a scanning exposure method which can control the dispersion in integrated amounts of light at a low level between shot areas or between wafers and which can readily keep integral exposure doses within a proper range in effecting exposure by the scanning exposure method using either the pulsed light source or the continuous light source. Another object of the present invention is to provide a scanning exposure apparatus capable of carrying out such a scanning exposure method.

A first scanning exposure method according to the present invention is a scanning exposure method to illuminate a mask with pulsed light and to synchronously scan the mask and a photosensitive substrate, thereby scan-exposing the photosensitive substrate with a pattern image of the mask, which comprises: detecting energy amounts of pulses of the pulsed light illuminating the mask during the scanning exposure; successively calculating, for every unit number of pulses (i.e., for each emission of a predetermined number of light pulses), an integrated amount of light of the last N pulses (where N is an integer more than one), based on the energy amounts thus detected; and adjusting an exposure dose on the photosensitive substrate in accordance with the sequence of integrated amounts of light thus calculated.

A second scanning exposure method according to the present invention is a scanning exposure method to illuminate a mask with continuous light and to synchronously scan the mask and a photosensitive substrate, thereby scan-exposing the photosensitive substrate with a pattern image of the mask, which comprises: detecting intensities or light amounts of the continuous light illuminating the mask during the scanning exposure; successively calculating, every lapse of a unit time or every movement of the mask or the photosensitive substrate by a unit distance, an integrated amount of light within the last predetermined time, based on the intensities or light amounts thus detected; and adjusting an exposure dose on the photosensitive substrate in accordance with a change in the sequence of integrated amounts of light thus calculated.

A first scanning exposure apparatus according to the present invention is a scanning exposure apparatus arranged to illuminate an illumination area of a predetermined shape with pulsed light from a pulsed light source for exposure and to synchronously scan a mask having a pattern for transfer and a photosensitive substrate relative to the illumination area, thereby exposing the pattern of the mask onto the photosensitive substrate, which has an irradiation energy detector for successively detecting energy amounts of respective light pulses during scanning exposure; a calculator for successively calculating integrated amounts of light of the last predetermined N pulses (where N is an integer more than one) at intervals of a unit number of pulses, using the results of detection by the irradiation energy detector; and an exposure dose controller for adjusting an exposure dose on the photosensitive substrate in accordance with a change in the sequence of integrated amounts of light calculated by the calculator.

In this case, an example of the exposure dose controller adjusts the exposure dose on the photosensitive substrate while the pattern of the mask is continuously printed (or exposed) on one shot area on the photosensitive substrate by the scanning exposure method.

Another example of the exposure dose controller adjusts the exposure dose on the photosensitive substrate in accordance with a change in the integrated amounts of light of the last pulses every exposure of the pattern of the mask on one shot area or every exposure thereof on plural shot areas on the photosensitive substrate by the scanning exposure method.

A further example of the exposure dose controller may be arranged to finely adjust the pulse energy of each light pulse from the pulsed light source.

Another example of the exposure dose controller is one for adjusting a number of irradiation pulses projected onto each of points on the photosensitive substrate while each of the points on the photosensitive substrate traverses an exposure area illuminated by the pulsed light in a scan direction, for example by changing a scan speed.

Further, the calculator is preferably arranged to calculate the integrated amounts of light under such conditions that the unit pulse number is one and that a number of pulses necessary for supplying a proper exposure dose to the photosensitive substrate is N.

A second scanning exposure apparatus according to the present invention is a scanning exposure apparatus arranged to illuminate a mask with continuous light and to synchronously scan the mask and a photosensitive substrate, thereby scan-exposing the photosensitive substrate with a pattern image of the mask, which comprises: a detector for detecting intensities or light amounts of the continuous light illuminating the mask; a calculator for successively calculating integrated amounts of light in the last predetermined time at intervals of unit times or every movement of the mask or the photosensitive substrate by a unit distance, based on the results of detection by the detector; and an exposure dose controller for adjusting an exposure dose on the photosensitive substrate in accordance with a change in the sequence of integrated amounts of light calculated by the calculator.

In this case, the calculator may be arranged to calculate the integrated amounts of light under such a condition that the predetermined time is defined as a time in which a predetermined point on the photosensitive substrate traverses the projection area of the pattern image of the mask in the scan direction.

For example, supposing the irradiation pulse number of light pulses at each point on the photosensitive substrate is N, the first scanning exposure method (or first scanning exposure apparatus) of the present invention as described above can detect an integrated exposure dose at each point on the photosensitive substrate, for example, by calculating an integrated amount of light of the last N pulses by the calculator. Strictly speaking, a small difference could arise between an integrated value of light amount detected for example by the irradiation energy detector and actual integral exposure energy on the photosensitive substrate because of the state of intensity distribution of illumination light on the photosensitive substrate etc., but the integrated value can be approximately regarded as actual integral exposure energy.

In the present invention, the exposure dose controller thus adjusts the exposure dose on the photosensitive substrate during exposure on each shot area, during transfer from a certain shot area to a next shot area, or every irradiation of a light pulse so that an integrated exposure dose obtained by multiplying an integrated amount of light thus calculated, for example, by a factor preliminarily obtained becomes equal to a predetermined proper exposure dose. If based on an immediately preceding integrated exposure dose calculated or an average of integrated exposure doses in shot areas up to immediately preceding exposure, for example stability of integrated exposure doses exceeds a permissible range, an error amount (correction amount) of integrated exposure dose is calculated before irradiation of a next light pulse or before exposure of a next shot area, respectively, and the exposure dose of a light pulse is adjusted thereby, for performing exposure; or, for example the scan speed is changed to adjust the number of irradiation pulses at each point on the photosensitive substrate, for performing exposure. This can decrease the dispersion in integrated exposure doses between shot areas or between photosensitive substrates, whereby the integrated exposure doses can readily be kept within a proper range.

In this case, the unit pulse number can be arbitrarily determined, but the highest accuracy of the exposure dose control can be attained when the unit pulse number is one.

Next, because the second scanning exposure method (or the second scanning exposure apparatus) of the present invention uses continuous light as illumination light, the light amounts (or intensities) of the illumination light are continuously detected by the detector, for example such as a photoelectric detector. Then a change of actual integrated exposure doses on the photosensitive substrate can be accurately estimated by successively obtaining an integrated amount of light in the last predetermined time (for example, the exposure time at each point on the photosensitive substrate) every lapse of a predetermined unit time (for example, about a time necessary for calculation of an integrated amount of light). Then, the exposure dose on the photosensitive substrate is adjusted through the exposure dose controller, for example through a variable reducer of illumination light or a control system of scan velocities of the mask and photosensitive substrate, during exposure in each shot area or during transfer from a certain shot area to a next shot area so that the integrated exposure doses thus estimated become equal to the predetermined proper exposure dose. This can decrease the dispersion in the integrated exposure doses between shot areas or between photosensitive substrates, whereby the integrated exposure doses can readily be kept within a proper range.

DETAILED DESCRIPTION OF THE PREFERRED EMBODIMENT

An embodiment of the present invention will be explained by reference to the drawings. The present embodiment is an example in which the present invention is applied to a projection exposure apparatus of the step-and-scan method having an exposure light source of the pulse oscillation type as a light source.

Figure 1:
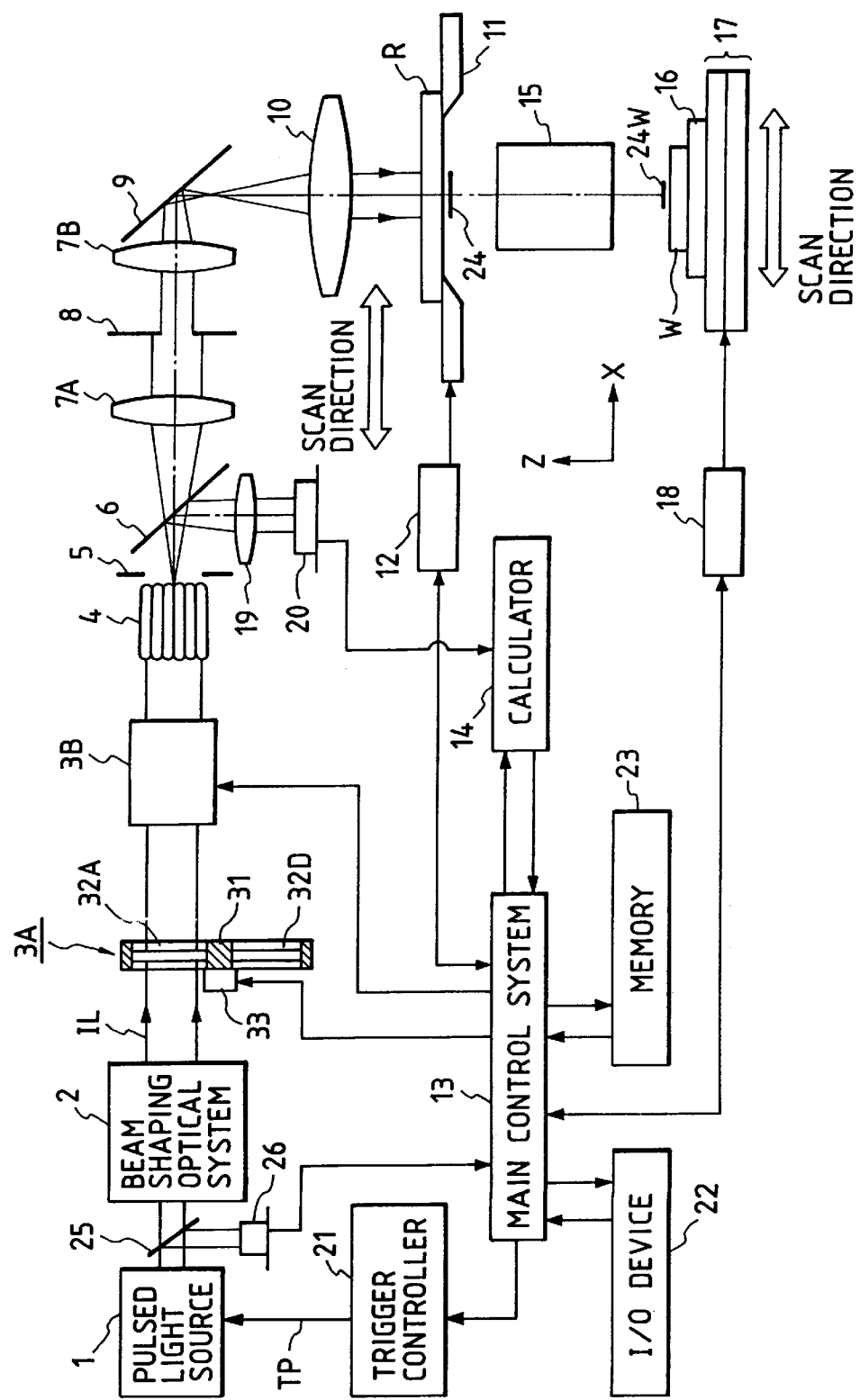
FIG. 1 is a structural drawing, partly in cross section, to show a projection exposure apparatus of the step-and-scan method as an embodiment of the present invention.

FIG. 1 shows the projection exposure apparatus of the present embodiment. In FIG. 1, a laser beam emitted from a pulsed light source 1 of the pulse oscillation type is shaped by a beam shaping optical system 2 comprised of a cylinder lens or a beam expander, etc. to have such a beam cross section that the beam can efficiently enter a succeeding fly-eye lens 4. An excimer laser light source, for example the KrF excimer laser (wavelength 248 nm) or the ArF excimer laser (wavelength 193 nm), is used as the pulsed light source 1.

The laser beam IL emitted from the beam shaping optical system 2 is successively incident to a rough energy adjuster 3A for rough adjustment of laser beam energy and a fine energy adjuster 3B for fine adjustment of laser beam energy. The rough energy adjuster 3A is arranged in such a manner that a plurality of optical filter plates (among which only two optical filter plates 32A and 32D are shown in FIG. 1) with different transmittances are arranged around a rotary plate 31 and that the rotary plate 31 is rotated by a drive motor 33. Rotating the rotary plate 31 can change the transmittances for the laser beam IL incident thereto one from another in plural steps. The detailed structure of the rough energy adjuster 3A is disclosed for example in U.S. Pat. No. 4,970,546. Here, a transmittance obtained by dividing a light amount of the laser beam emerging from the rough energy adjuster 3A by a light amount of the laser beam incident thereto will be called as a rough adjustment amount $T_R$ in the rough energy adjuster 3A.

Further, the fine energy adjuster 3B is composed of, for example, two diffraction gratings arranged as relatively movable (double grating method) as disclosed in U.S. Pat. No. 5,191,374. The fine energy adjuster 3B is arranged in such a manner that a ratio of emergent light amount to incident light amount (transmittance) can be continuously changed within a predetermined range by slightly changing relative positions of the two diffraction gratings. Another construction of the fine energy adjuster 3B may be one composed of, for example, two optical filter plates the transmittance of which can be finely adjusted according to respective angles of incidence of light thereto, and a drive unit for adjusting a crossing angle between the two optical filter plates within a predetermined range, whereby the transmittance for the laser beam incident thereto can be finely adjusted within the predetermined range by adjusting the crossing angle between the two optical filter plates. Another example of the fine energy adjuster 3B may be an acousto-optic modulator utilizing the Raman-Nath diffraction (Debye-Sears effect), whereby the amount of transmitted light can be continuously changed by controlling a state of modulation in the acousto-optic modulator.

Another example of the fine energy adjuster 3B may be one for adjusting an applying voltage (or a charging voltage) to the pulsed light source 1 so as to change the pulse energy supplied from the light source, as disclosed for example in U.S. Pat. No. 5,191,374.

Figure 3:
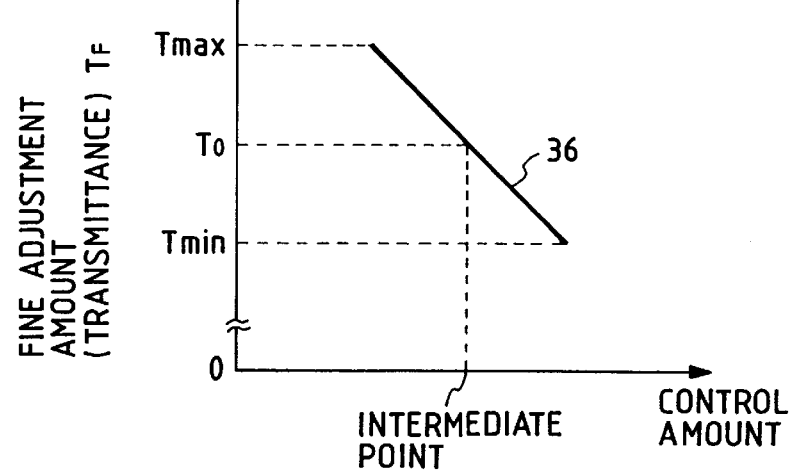
FIG. 3 is a drawing to show a relation between control amount and fine adjustment amount $T_F$ in a fine energy adjuster 3B in FIG. 1.

A straight line 36 in FIG. 3 represents a relation between control amount from the outside over the drive unit in the fine energy adjuster 3B, and change amount of transmittance. In FIG. 3, a transmittance obtained by dividing a light amount of the emerging laser beam by a light amount of the incident laser beam is defined as a fine adjustment amount $T_F$. In this example, an adjustment range of the fine adjustment amount $T_F$ is a continuous range of from a predetermined minimum value $T_{min}$ to a predetermined maximum value $T_{max}$, and, by setting the control amount over the internal drive unit to the median (intermediate point), the fine adjustment amount $T_F$ is adjusted to be the median $T_0$ between the minimum value $T_{min}$ and the maximum value $T_{max}$. Further, whenever the fine energy adjuster 3B is reset, the control amount is set to the intermediate point, whereby the fine adjustment amount $T_F$ is set to the median $T_0$.

The laser beam IL emerging from the fine energy adjuster 3B is incident to the fly-eye lens 4. The fly-eye lens 4 forms secondary light sources (a lot of light source images) for illuminating succeeding field stop 8 and reticle R in a uniform illuminance distribution. An aperture stop 5 of the illumination system is placed on the exit plane side of fly-eye lens 4 in the vicinity thereof, and the laser beam emerging from the secondary light sources inside the aperture stop 5 is incident to a beam splitter 6 with low reflectivity but high transmittance. The laser beam passing through the beam splitter 6 advances through a first relay lens 7A and then passes through an aperture in the field stop (fixed reticle blind) 8. The field stop 8 in the present embodiment is located at a position slightly defocused from the conjugate plane with the pattern surface of reticle, and the shape of the aperture in the field stop 8 is rectangular.

The laser beam passing through the field stop 8 then travels via a second relay lens 7B, a path-bending mirror 9, and a main condenser lens 10 to illuminate the reticle R on a reticle stage 11 in a uniform illuminance distribution. In this case, because the plane where the field stop 8 is placed is defocused from the conjugate plane with the pattern surface of the reticle R, the laser beam impinges upon an illumination area 24 of a rectangular slit shape on the reticle R, which is an image with unfocused edges of the aperture in the field stop 8. In this case, the width of the illumination area 24 in the scan directions can be adjusted by changing the shape of the aperture in the field stop 8 through a drive unit (not shown).

An image of a pattern in the illumination area 24 on the reticle R is projection-printed through a projection optical system 15 on the wafer W. An area conjugate with the slit illumination area 24 with respect to the projection optical system 15 is defined as a slit exposure area 24W. Further, the Z-axis is taken in parallel with the optical axis of the projection optical system 15, the X-direction is taken along the scan directions (i.e., directions parallel to the plane of FIG. 1) of the reticle R relative to the slit illumination area 24 in a plane normal to the optical axis, and the Y-direction along a non-scan direction normal to the scan directions. According to this convention, the reticle stage 11 is scanned in the X-direction by a reticle stage drive unit 12. The reticle stage drive unit 12 is under control of a main control system 13 for generally controlling the operation of the entire apparatus. A length measuring device (laser interferometer etc.) for detecting an X-directional coordinate of the reticle stage 11 is incorporated in the reticle stage drive unit 12, and the X-coordinate of the reticle stage 11 measured thereby is supplied to the main control system 13.

The wafer W is mounted through a wafer holder 16 on an XY stage 17 arranged as movable at least in the X-direction (rightward or leftward on the plane of FIG. 1). Although not shown, a Z stage etc. for positioning the wafer W in the Z-direction is provided between the XY stage 17 and the wafer holder 16. During scanning exposure, the reticle R is scanned at a velocity $v_R$ in the +X-direction (or in the −X-direction) while the wafer W is scanned by the XY stage 17 at a velocity $\beta \cdot v_R$ in the −X-direction (or in the +X-direction) relative to the exposure area (projection area of the pattern image of reticle) 24W in synchronization with the scanning of reticle R, where β is a projection magnification of the projection optical system 15 from the reticle R to the wafer W. The main control system 13 controls the operation of the XY stage 17 by a wafer stage drive unit 18. A length measuring device (laser interferometer etc.) for detecting X-directional and Y-directional coordinates of the XY stage 17 is incorporated in the wafer stage drive unit 18, and the X-coordinate and Y-coordinate of the XY stage 17 measured thereby are supplied to the main control system 13.

Figure 2A:
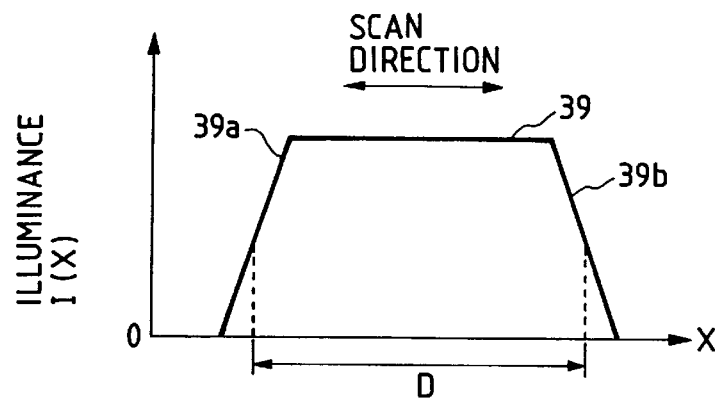
FIGS. 2A and 2B are drawings to show illuminance distributions in the scan direction, of a slit exposure area on the wafer.
Figure 2B:
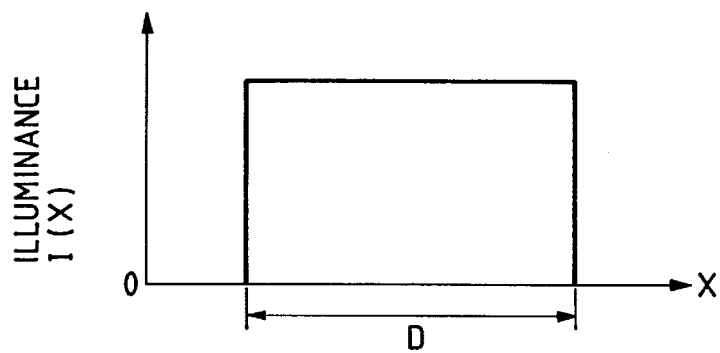

Here is explained an illumination distribution in the scan direction (X-direction), of the slit exposure area 24W on the wafer W. A trapezoid distribution curve 39 in FIG. 2A represents illuminances I(X) at positions X in the scan direction, of the exposure area 24W. In FIG. 2A, a width D in the scan direction between two points where a value of illuminance I(X) becomes the half of the maximum will be called as a width in the scan direction, of the exposure area 24W (hereinafter also referred to as a "slit width"). In this case, because −X-directional edge 39a and +X-directional edge 39b of the distribution curve 39 are symmetric, the illuminance distribution of the exposure area 24W on the wafer W is substantially equivalent to a rectangular distribution with the width D in the scan direction, as shown in FIG. 2B.

Returning to FIG. 1, the laser beam reflected by the beam splitter 6 is received through a condenser lens 19 by an integrator sensor 20 comprised of a photoelectric conversion element, and a photoelectric conversion signal from the integrator sensor 20 is supplied to a calculator 14 through an amplifier and an analog-to-digital converter not shown. A specific example of the integrator sensor 20 is a pin photodiode being sensitive in the far-ultraviolet region and having high response frequencies for detecting the pulsed light from the pulsed light source 1. A relation is preliminarily obtained between the photoelectric conversion signal from the integrator sensor 20 and the illuminance of the pulsed light on the exposure surface of wafer W. Namely, the photoelectric conversion signal from the integrator sensor 20 is preliminarily calibrated.

Based on the photoelectric conversion signal from the integrator sensor 20, the calculator 14 measures the dispersion in light amounts of light pulses output from the pulsed light source 1, and it integrates the photoelectric conversion signal for every light pulse to successively calculate integrated exposure doses at respective points on the wafer W and then to supply them to the main control system 13.

The main control system 13 supplies an emission trigger signal TP through a trigger controller 21 to the pulsed light source 1, thereby controlling timing of light emission of the pulsed light source 1. Concerning this, a beam splitter 25 with high transmittance but low reflectivity is located on the optical path of the laser beam between the pulsed light source 1 and the beam shaping optical system 2, and the laser beam reflected by the beam splitter 25 is received by an energy monitor 26 comprised of a photoelectric conversion element. A photoelectric conversion signal from the energy monitor 26 is supplied to the main control system 13 through an amplifier and an analog-to-digital converter not shown, and the main control system 13 measures output power from the pulsed light source 1, based on the photoelectric conversion signal from the energy monitor 26, and adjusts the output power from the pulsed light source 1 when necessary.

Further, the main control system 13 controls the transmittance for the laser beam IL by rotating a rotary motor 33 in the pough energy adjuster 3A or by driving the drive unit 35 in the fine energy adjuster 3B to effect control of exposure dose. An operator can input pattern information of reticle R etc. through an I/O device 22 to the main control system 13, and the main control system 13 is provided with a memory 23 for storing various information.

Figure 4B:
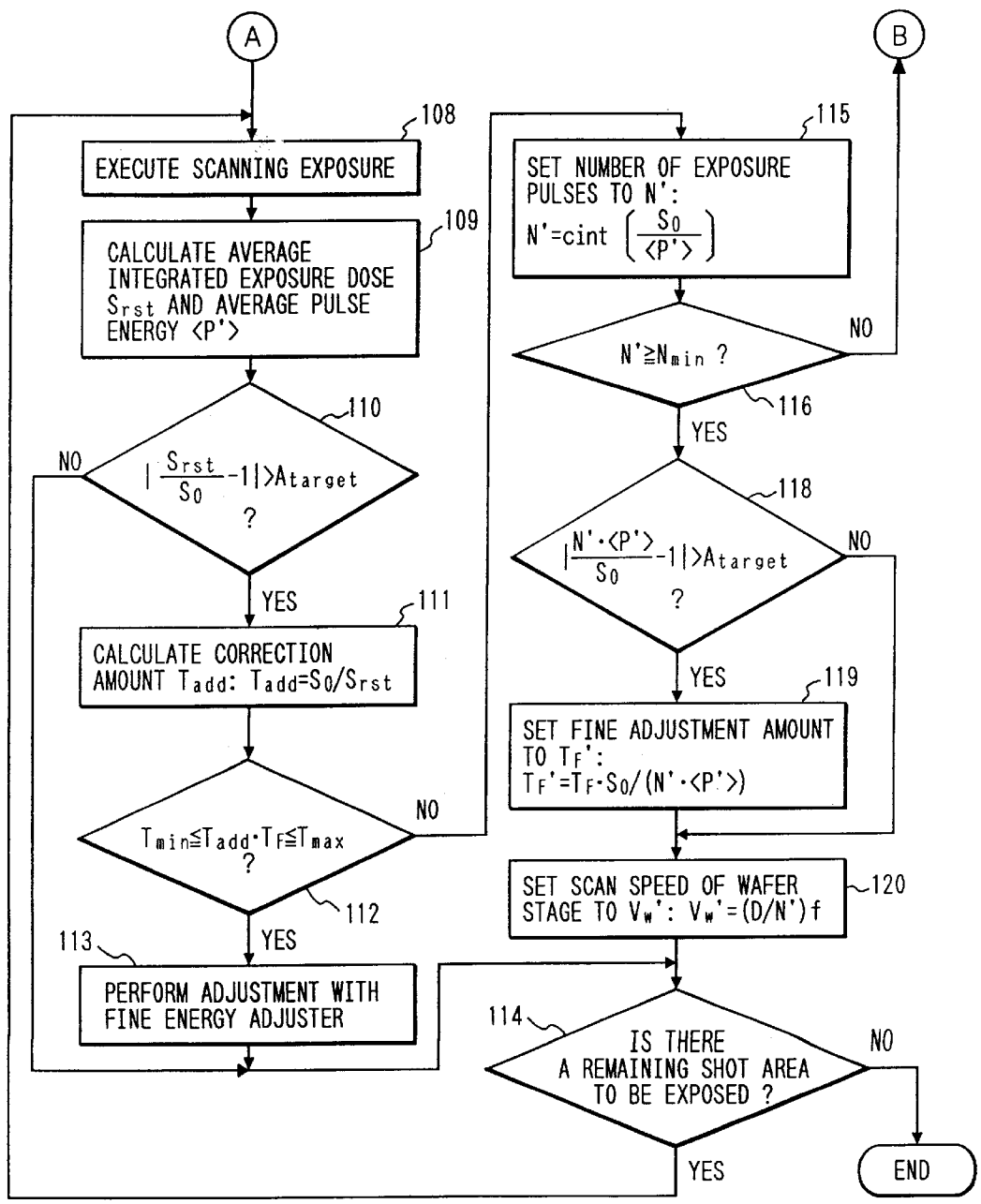
FIG. 4 is comprised of FIGS. 4A and 4B showing a flowchart illustrating an example of exposure operation in the embodiment.

An example of the exposure operation in the present embodiment is next explained referring to the flowchart of FIGS. 4A and 4B. The exposure dose control of the present embodiment is carried out in the pulse count method in each shot area and is arranged to effect a predetermined energy-change between exposures of shot areas. First at step 101 in FIG. 4A, the operator manipulates the I/O device 22 in FIG. 1 to set in the main control system 13, for example coordinates of centers (exposure positions) of many shot areas as exposed objects on the wafer W, a moving distance (scan length) L in the scan direction, of the wafer W upon performing exposure in each shot area, and a target integrated exposure dose $S_0$ [mJ/cm$^2$] to be supplied per point on the wafer W. Next, at step 102 the main control system 13, for example, drives the XY stage 17 to make the pulsed light source 1 emit light in such a state that the wafer W is withdrawn (or in such a state that a shutter is disposed between the beam splitter 6 and the wafer W and is closed), monitors energy of the laser beam of plural output pulses through the integrator sensor 20, and obtains an average of energy for each pulse (average pulse energy) <P> of the current laser beam IL. On this occasion, it is also possible to obtain a ratio $\delta P/<P>$, which is a ratio of a threefold (3σ) value (dispersion) δP of a standard deviation a of pulse energy of the laser beam IL to the average <P>. Subsequently, a number N of exposure pulses for irradiation at a point on the wafer is calculated according to the following equation.

$$N = \text{int}(S_0/<P>) \quad (1)$$

Here, the function int(a) is an integral part of real number a, that is, a maximum integer not exceeding the real number a. Next obtained based on the ratio $\delta P/<P>$ of the dispersion δP (the value of 3σ) of pulse energy, for example which is preliminarily measured and set as a device constant, to the average <P>, is a minimum exposure pulse number $N_{min}$ necessary for controlling the dispersion in integrated exposure doses in each shot area on the wafer within a predetermined permissible value. The operation may also be arranged so that the minimum exposure pulse number $N_{min}$ necessary for controlling the dispersion in integrated exposure doses in each shot area on the wafer within the predetermined permissible value is obtained based on the ratio $\delta P/<P>$ in pulse energy of the laser beam, measured at step 102. Then it is determined whether the exposure pulse number N obtained by Equation (1) is not less than the minimum exposure pulse number $N_{min}$ (step 103). On this occasion, if $N<N_{min}$, the flow goes to step 104 to increase a reduction rate of light in the rough energy adjuster 3A in FIG. 1 so as to satisfy $N \geq N_{min}$, and then returns to step 102. After that, when at step 103 the exposure pulse number N becomes not less than the minimum exposure pulse number $N_{min}$, the flow goes to step 105.

Figure 6:
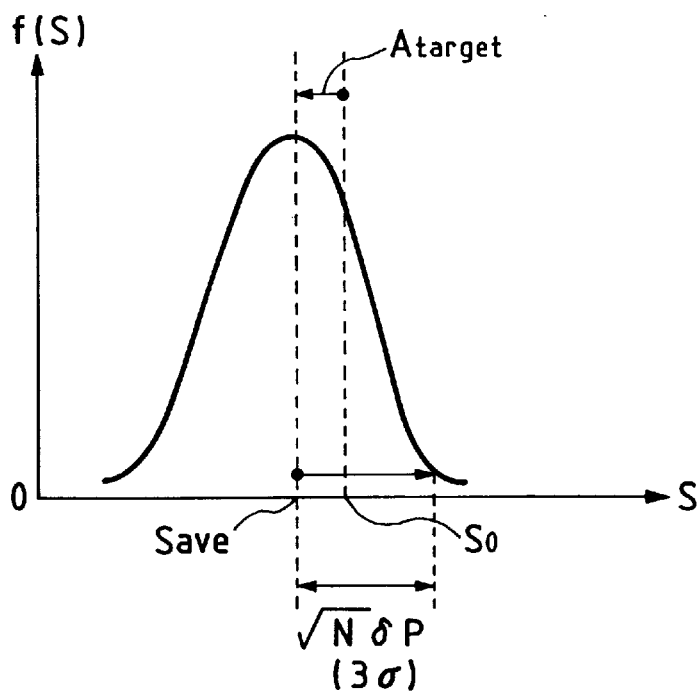
FIG. 6 is a drawing to show a distribution of integrated exposure doses where the pulse energy from the pulsed light source is scattered in a Gaussian distribution.

In the method of successive exposures with light pulses from a pulsed light source 1 as in the present embodiment, a distribution of integrated exposure dose S per point on the wafer becomes a normal distribution with the average of $N<P>(=S_{ave})$ and the 3σ value of $N^{1/2} \cdot \delta P$, as shown by a distribution function f(S) in FIG. 6. Letting $A_{rep}$ be dosage repeatability (3σ) of integrated exposure dose necessary at each point on the wafer, the minimum exposure pulse number $N_{min}$ necessary for keeping the dosage repeatability (3σ) of integrated exposure dose of plural pulses within $A_{rep}$ is determined so as to satisfy the following condition.

$$N_{min} > [(\delta P/<P>)/A_{rep}]^2 \quad (2)$$

Further, the average N<P> of integrated exposure doses at respective points on the wafer needs to drop within the range of a predetermined target dose accuracy $A_{target}$ with respect to a target integrated exposure dose $S_0$ set. Namely, the following condition needs to hold.

$$|(N<P>/S_0) - 1| \leq A_{target} \quad (3)$$

Then it is determined at step 105 whether the condition (3) is satisfied. If the condition (3) is not satisfied, the main control system 13 adjusts the value of average pulse energy <P> by setting the fine adjustment amount T in the fine energy adjuster 3B in FIG. 1 to the one expressed by the following equation (step 106).

$$T = S_0/(<P>N) \quad (4)$$

The fine adjustment amount (transmittance) T in the fine energy adjuster 3B changes between the minimum value $T_{min}$ and the maximum value $T_{max}$, as already explained referring to FIG. 3, and the maximum value $T_{max}$ and minimum value $T_{min}$ can be expressed as follows using the minimum exposure pulse number $N_{min}$ and target dose accuracy $A_{target}$ as described above.

$$T_{max} = (N_{min}+1)(1-A_{target})/N_{min} \quad (5A)$$

$$T_{min} = N_{min}(1+A_{target})/(N_{min}+1) \quad (5B)$$

The value of fine adjustment amount T is set to $(T_{max}+T_{min})/2$, or $T_0$ in the initial state or upon reset.

Next, if the condition of Equation (3) is satisfied at step 105 or after step 106 is executed, the main control system 13 moves to step 107 to set the scan velocity $v_W$ in the X-direction by the XY stage 17 in the wafer stage in FIG. 1 to the following value.

$$V_W = (D/N)f \quad (6)$$

In this equation, D denotes the width in the scan direction, of the exposure area 24W as explained with FIG. 2A and f a frequency of the pulsed light from the pulsed light source 1. Using the projection magnification β (where β is for example ⅕, ¼, etc.) of the projection optical system 15 from the reticle R to the wafer W, the scan velocity $V_R$ in the X-direction, of the reticle stage 11 is given by $-(1/\beta)(D/N)f$.

The above processing completes the initial setting, and then at step 108 the main control system 13 executes exposure of the pattern image of reticle R in a designated shot area on the wafer W by the scanning exposure method with the exposure dose thus set. During this scanning exposure the calculator 14 calculates, through the integrator sensor 20, integrated exposure doses on the outstanding shot area on the wafer W with the laser beam IL from the pulsed light source 1. In this case, because the number of exposure pulses for one point on the wafer W is N, the calculator 14 successively calculates the integrated exposure doses S by integrating the pulsed photoelectric conversion signal from the integrator sensor 20 N pulses each M times (where M is an integer more than one) while the outstanding shot area on the wafer W is scanned relative to the exposure area 24W in FIG. 1. This can obtain integrated exposure doses $S_j$ at M positions $X_j$ (j=1 to M) arranged approximately at equal intervals in the X-direction on the wafer W.

In more detail, assuming that $p_1, p_2, p_3, \ldots$ are exposure doses of respective pulses in the laser beam IL on the wafer W (results measured indirectly through the integrator sensor 20), the calculator 14 calculates the integrated exposure doses $S_j$ by successively integrating N exposure doses of from the j-th exposure dose $p_j$ to the (N+j−1)-th exposure dose $p_{N+j-1}$. More specifically, the integrated exposure doses $S_1, S_2, \ldots, S_M$ are obtained as follows.

$$S_1 = p_1 + p_2 + \ldots + p_{N-1} + p_N \tag{7A}$$

$$S_2 = p_2 + p_3 + \ldots + p_N + p_{N+1} \tag{7B}$$

$\ldots$ $$S_M = p_M + p_{M+1} + \ldots + p_{N+M-2} + p_{N+M-1} \tag{7Z}$$

Figure 5:
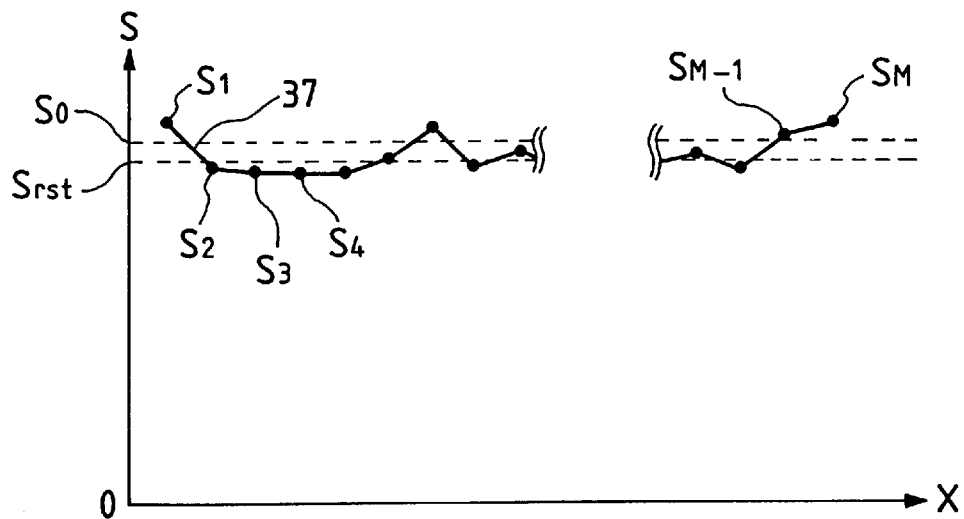
FIG. 5 is a drawing to show a sequence of integrated exposure doses measured during exposure in a certain shot area on the wafer in the embodiment.

FIG. 5 shows the integrated exposure doses S calculated for respective points in the X-direction within a shot area on the wafer W. In FIG. 5, line 37 represents the integrated exposure doses $S_j$ calculated by the calculator 14 for the positions $X_j$ (j=1 to M) on the wafer W. A dotted line represents the target integrated exposure dose $S_0$. Next at step 109, the calculator 14 calculates the average $S_{rst}$ of the M integrated exposure doses $S_j$ and average pulse energy $<P>$ in the exposure by the following equations, and then supplies results of these calculations to the main control system 13.

$$S_{rst} = (S_1 + \ldots + S_2 + S_M)/M \tag{8}$$

$$<P> = S_{rst}/N \tag{9}$$

Next, at step 110 the main control system 13 compares the above target dose accuracy $A_{target}$ with an error of target value $|(S_{rst}/S_0)-1|$, which is an error of the average $S_{rst}$ of actually integrated exposure doses in the shot area exposed, with respect to the target integrated exposure dose $S_0$. If the following condition holds or if the target value error exceeds the target dose accuracy $A_{target}$, the main control system 13 proceeds to step 111 to calculate a necessary correction amount of exposure dose.

$$|(S_{rst}/S_0)-1| > A_{target} \tag{10}$$

More specifically, at step 111 the main control system 13 sets a correction amount $T_{add}$, which is a value obtained by dividing an exposure dose after corrected, of each pulse in the laser beam IL by a current exposure dose, to the one as expressed by the following equation.

$$T_{add} = S_0/S_{rst} \tag{11}$$

In this case, the memory 23 stores as information on the previous shot area the values of the rough adjustment amount (transmittance) $T_R$ of exposure dose in the rough energy adjuster 3A and the fine adjustment amount $T_F$ of light amount in the fine energy adjuster 3B for the shot area having been exposed. Then the main control system 13 checks at step 112 whether a value obtained by multiplying the fine adjustment amount $T_F$ of the fine energy adjuster 3B by the correction amount $T_{add}$ is within the control range of the fine energy adjuster 3B, as expressed below.

$$T_{min} \leq T_{add} \cdot T_F < T_{max} \tag{12}$$

When condition (12) holds, the main control system 13 changes the fine adjustment amount $T_F$ of fine energy adjuster 3B to $T_{add} \cdot T_F (=T_F')$ (step 113), and thereafter determines whether there remains a shot area to be exposed (step 114). If there is a remaining shot area to be exposed the main control system 13 proceeds to step 108 to execute exposure in a next shot area by the scanning exposure method with the fine adjustment amount $T_F'$ of fine energy adjuster 3B newly set. On this occasion, integrated exposure doses become close to the target integrated exposure dose $S_0$, because the exposure doses are corrected based on the actually integrated exposure doses in the immediately preceding shot area.

If at step 110 the target value error $|(S_{rst}/S_0)-1|$ is not more than the target dose accuracy $A_{target}$, there is no need to change the exposure condition and thus, the flow goes directly to step 114 to execute exposure in the next shot area. This exposure step is ended when all shot areas to be exposed have been exposed.

If at step 112 the product of the fine adjustment amount $T_F$ and the correction amount $T_{add}$ is out of the range of condition (12), the main control system 13 proceeds to step 115 to set the exposure pulse number N per point on the wafer W to N' defined by the following equation under the precondition that the scan velocity of the wafer stage is changed (and the scan velocity of the reticle stage 11 is also changed at the same time). The average pulse energy $<P'>$ is the actual average pulse energy obtained by Equation (9).

$$N' = \text{cint}(S_0/<P'>) \tag{13}$$

Here, cint(a) is an integer closest to real number a, that is, an integer obtained by rounding the tenth's place of real number a. At next step 116, it is determined whether the exposure pulse number N' after corrected is not less than the necessary minimum exposure pulse number $N_{min}$. If N' is smaller than $N_{min}$, the fine energy adjuster 3B is reset at step 117 to set the fine adjustment amount $T_F$ to the median $T_0$. Thereafter, the flow returns to step 104 to adjust the rough adjustment amount of the rough energy adjuster 3A so as to satisfy N'>$N_{min}$, and then returns to step 102.

If N'>$N_{min}$ is satisfied at step 116, the main control system 13 proceeds to step 118 to compare the above target dose accuracy $A_{target}$ with an error of target value $|(N' \cdot <P'>/S_0)-1|$, which is an error of an integrated exposure dose N'·<P'> expected after correction with respect to the target integrated exposure dose So. If the following condition holds or if the target value error exceeds the target dose accuracy $A_{target}$, the main control system 13 proceeds to step 119 to calculate a necessary correction amount of exposure dose.

$$|(N' \cdot <P'>/S_0)-1| > A_{target} \tag{14}$$

Specifically, at step 119 the fine adjustment amount $T_F$ in the fine energy adjuster 3B is changed to $T_F'$ below defined.

$$T_F' = T_F \cdot S_0/(N' \cdot <P'>) \tag{15}$$

Then at step 120 the main control system 13 changes the scan velocity $v_W$ of the XY stage 17 in the wafer stage to $v_W'$ defined by the following equation (and the scan velocity of the reticle stage 11 is also changed at the same time). After that, the operation proceeds to step 114 to execute exposure in a next shot area.

$$v_W' = (D/N')f \tag{16}$$

If at step 118 the target error $|(N' \cdot <P'>/S_0)-1|$ expected is not more than the target dose accuracy $A_{target}$, the operation transfers directly to step 120 without changing setting of the fine energy adjuster 3B, to change the scan velocity $v_W$ of the wafer stage to $v_W'$ of Equation (16), and thereafter exposure is executed in the next shot area.

As described above, the operation of the present embodiment as shown in FIGS. 4A and 4B is arranged to repeat, between exposures in respective shot areas, the control of exposure dose to correct the rough adjustment amount $T_R$ in the rough energy adjuster 3A, the fine adjustment amount $T_F$ in the fine energy adjuster 3B, or the scan velocity $v_W$ of the wafer stage (or the both of fine adjustment amount $T_F$ and scan velocity $v_W$), based on the integrated exposure doses measured in the immediately previous shot area exposed, as shown in steps 109 to 120 (except for step 117). Accordingly, the integrated exposure doses in respective shot areas become accurately close to the target integrated exposure dose. Then this exposure dose control is repeated until the measurement of average pulse energy of the laser beam from the pulsed light source 1 is actually carried out next time as shown at step 102 (which will be called "energy check"). However, though the energy check is carried out at step 102 on the occasion of changing the rough adjustment amount $T_R$ in the rough energy adjuster 3A as indicated at step 117, a frequency of changing the rough adjustment amount $T_R$ in the rough energy adjuster 3A is considerably low between exposures in shot areas.

The above energy check is normally carried out at intervals of exchanges of wafers or at intervals of exchanges of lots of wafers. Accordingly, the energy check does not need to normally be carried out for example during exposure in a wafer, and thus, the throughput of the exposure step (the number of processed wafers per unit time) is maintained high.

Step 109 as described above is arranged to calculate the average $S_{rst}$ of all M integrated exposure doses $S_j$ (j=1 to M) shown in FIG. 5 by Equation (8), but instead thereof, the average may be replaced by an average $S_{rst}'$ of the last m (m<M) integrated exposure doses $S_j$.

$$S_{rst}'=(S_{M-m+1}+S_{M-m+2}+\ldots+S_M)/m \tag{17}$$

By this, the exposure dose control can be carried out in response to a shorter-term output change of the pulsed light source 1.

Further, the embodiment as described above uses the rough energy adjuster 3A and fine energy adjuster 3B as modulators for pulse energy, but the pulsed light source 1 itself may be modified as an energy modulator by controlling the electric power (or applied voltage) of the pulsed light source 1, for example. In this case, the utility factor of energy can be improved as a whole, because there is no energy loss of $(1-T_0)$ based on the fine adjustment amount (transmittance) $T_0$ in the initial state of the fine energy adjuster 3B, for example.

The embodiment of FIGS. 4A and 4B is arranged to correct the exposure dose when the average $S_{rst}$ of integrated exposure doses exceeds the permissible value, as shown at steps 110 and 111, but another possible arrangement is such that even if the average $S_{rst}$ is within the permissible value, data on average $S_{rst}$ is stored continuously for exposure in each shot area and that if the average $S_{rst}$ has an increasing or decreasing tendency, the exposure dose is preliminarily corrected before the average $S_{rst}$ actually exceeds the permissible value. This predictive control has an advantage of decreasing the number of shot areas integrated exposure doses of which become out of the permissible value.

Further, the embodiment as described above is arranged to change the exposure dose through the fine energy adjuster 3B etc. between exposures in respective shot areas, but the exposure dose may be modified through the fine energy adjuster 3B etc. based on the last partial integrated exposure doses during each pulse exposure. This can make the integrated exposure dose in each shot area more accurately close to the target integrated exposure dose.

The above embodiment uses the pulsed light source as an exposure light source, but a continuous light source, for example such as a mercury lamp, may be used as an exposure light source. For example, if the continuous light source (for example, a mercury lamp) is used in place of the pulsed light source 1, as in U.S. Pat. No. 5,194,893, intensities (or light amounts) of the continuous light illuminating the reticle R are continuously detected during scanning exposure by the integrator sensor 20, and photoelectric conversion signals output from the integrator sensor 20 are taken at a predetermined high sampling frequency through a sample/hold circuit and an analog-to-digital converter into the calculator 14. Letting τp be a time necessary for calculation of integrated light amount in the calculator 14 or a time necessary for the reticle R (or wafer W) to move by about a detection resolution (for example about 0.01 μm) of the interferometer 12 (or interferometer 18) during scanning exposure, the time τp is taken as a unit time. Further, letting τp be a time (exposure time) for each point on the wafer W to traverse the slit exposure area 24W, the calculator 14 calculates an integrated value (integrated light amount) of photoelectric conversion signals in the last time Tp for every unit time τp (at time intervals τp).

Further, the calculator 14 successively calculates integrated exposure doses heretofore on the wafer W at time intervals τp by multiplying the integrated values by a factor preliminarily obtained. Then the main control system 13 controls the exposure dose on the wafer W for example through the fine energy adjuster 3B etc. so that the sequence of integrated exposure doses thus obtained at time intervals τp become closer to a proper exposure dose. In this case, even using the continuous light, the actual integrated exposure doses at respective points on the wafer W can be obtained almost exactly, because the integrated exposure doses are obtained by successively integrating the photoelectric conversion signals from the integrator sensor 20 for actual exposure time. Accordingly, the exposure dose control can be carried out on an accurate basis.

Instead of obtaining the integrated values of photoelectric conversion signals at intervals of unit times τp, an integrated value of photoelectric conversion signals may be successively obtained within the last time Tp every movement of the reticle R or wafer W by a unit distance. The unit distance in this case may be set to about the detection resolution of the interferometers 12, 18, for example.

The above embodiment is an example in which the present invention is applied to the projection exposure apparatus of the scanning exposure type provided with the projection optical system consisting of a refracting system, but in addition thereto, the present invention can also be applied, for example, to scanning exposure apparatus including projection exposure apparatus provided with a catadioptric projection optical system, exposure apparatus of the proximity method, exposure apparatus of the contact method, etc. As explained, the present invention may include a variety of arrangements within a scope not departing from the essence of the present invention.

According to the first scanning exposure method or the first scanning exposure apparatus of the present invention, the integrated exposure doses are obtained by successively integrating the last N pulses for every irradiation of pulsed illumination light and a change in the sequence of integrated exposure doses is fed back to adjust the exposure dose on the photosensitive substrate, for example, by adjusting the transmittance for the pulsed illumination light (energy modulation) or adjusting the scan velocity. Accordingly, even with an output change of the pulsed light source in performing exposure by the scanning exposure method using the pulsed light source, the dispersion in integrated exposure doses becomes less, for example between shot areas or between photosensitive substrates (wafers etc.), thus presenting an advantage that the integrated exposure doses can be readily maintained within the proper range.

Since the control is carried out based on the integrated exposure doses having actually been exposed, it is unnecessary to measure the dispersion in pulse energy with test emission of the pulsed light source, thus presenting an advantage that the throughput (productivity) of the exposure step can be maintained so as not to decrease.

Next, where the exposure dose controller adjusts the exposure dose on the photosensitive substrate while the pattern of a mask is continuously printed on one shot area on the photosensitive substrate by the scanning exposure method, the control is carried out during exposure in the shot area, whereby the integrated exposure doses in respective shot areas can be readily maintained within the proper range.

When the exposure dose controller adjusts the exposure dose on the photosensitive substrate in accordance with the integrated exposure dose of the last illumination light pulses every completion of exposure of one shot area or every completion of exposures on some shot areas on the photosensitive substrate by the scanning exposure method, the dispersion in integrated exposure doses becomes less between shot areas.

Further, when the exposure dose controller finely adjusts the pulse energy of each illumination light pulse from the pulsed light source, the integrated exposure doses can be maintained within the proper range with higher accuracy.

In the cases where the exposure dose controller adjusts the number of irradiation pulses given at respective points, for example by adjusting the scan velocity, while the points on the photosensitive substrate traverse the exposure area by the pulsed illumination light in the scan direction, there is an advantage that the exposure dose can be largely changed, especially when the integrated exposure doses are largely off from the target integrated exposure dose.

When the calculator calculates the integrated light amounts under such conditions that the unit pulse number is 1 and that the number of pulses necessary for supplying the proper exposure dose to the photosensitive substrate is N, the exposure dose control can be-carried out at the highest accuracy.

Next, according to the second scanning exposure method or the second scanning exposure apparatus of the present invention, the intensities or light amounts of the continuous light are continuously detected, integrated light amounts in the last predetermined time are successively calculated as the detection values are shifted in unit times (or every movement of the mask or the photosensitive substrate by a unit distance), and a change in the sequence of integrated light amounts is fed back to adjust the exposure dose on the photosensitive substrate, for example, by adjusting the transmittance for the continuous light (energy modulation) or adjusting the scan velocity. Accordingly, even with an output change of the continuous light source in performing exposure by the scanning exposure method using the continuous light source, the dispersion in integrated exposure doses becomes less for example between shot areas or between photosensitive substrates (wafers etc.), thus presenting an advantage that the integrated exposure doses can be readily maintained within the proper range.

This arrangement also has an advantage that the actually integrated exposure doses on the photosensitive substrate can be accurately estimated when the integrated light amounts are calculated under such a condition that the predetermined time is defined as a time for each point on the photosensitive substrate to traverse the projection area of pattern image in the scan direction.

What is claimed is:

1. A scanning exposure apparatus in which a pattern of a mask is transferred onto a substrate, the apparatus comprising:

an illumination device which illuminates said mask with illumination light pulses, at least part of the illumination device being disposed in a path of the illumination light pulses;

a scan device functionally connected with the illumination device, which synchronously moves said mask and said substrate so that each point on said substrate is irradiated with N light pulses (N being an integer);

an irradiation energy detector which successively detects energy amounts of respective illumination light pulses during scanning exposure, at least part of the irradiation energy detector being disposed in the path of the illumination light pulses;

a calculator which is connected to the irradiation energy detector and which, every time a predetermined number of light pulses are emitted, successively calculates an integrated amount of the N light pulses preceding the calculating, using results of detection by said irradiation energy detector; and an exposure dose controller, connected to the calculator, which adjusts an exposure dose for said substrate, based on the integrated amounts calculated by said calculator.

2. The scanning exposure apparatus according to claim 1, wherein said exposure dose controller adjusts the exposure dose for said substrate during scanning exposure for one shot area on said substrate.

3. The scanning exposure apparatus according to claim 1, wherein said exposure dose controller adjusts the exposure dose for said substrate, in accordance with the integrated amount of said preceding N light pulses, for every exposure of one shot area or for every exposure of some shot areas on said substrate.

4. The scanning exposure apparatus according to claim 1, wherein said exposure dose controller adjusts pulse energy of each illumination light pulse from said pulsed light source.

5. The scanning exposure apparatus according to claim 1, wherein said exposure dose controller adjusts a number of illumination light pulses with which each point on said substrate is irradiated while said each point traverses an exposure area by said illumination light pulses in a scan direction.

6. The scanning exposure apparatus according to claim 1, wherein said calculator defines said predetermined number of light pulses as one.

7. A scanning exposure apparatus in which a pattern of a mask is transferred onto a substrate, the apparatus comprising:

an illumination device which illuminates said mask with continuous light, at least part of the illumination device being disposed in a path of the continuous light;

a detector which detects an intensity or light amount of the continuous light illuminating said mask, at least part of the detector being disposed in the path of the continuous light;

a calculator which is connected to the detector and which, for every prescribed time or every movement of said mask or said substrate by a prescribed distance, successively calculates an integrated amount in a predetermined time preceding the calculating, based on results of detection by said detector during scanning exposure; and an exposure dose controller, connected to the calculator, which adjusts an exposure dose for said substrate in accordance with the integrated amounts calculated by said calculator.

8. The scanning exposure apparatus according to claim 7, wherein said predetermined time is a time in which a certain point on said substrate traverses a projection area of a pattern image in a scan direction.

9. A scanning exposure method for transferring a pattern of a mask onto a substrate, the method comprising:

emitting light pulses for exposing each point on said substrate with N light pulses (N being an integer);

obtaining, every time a predetermined number of light pulses are emitted during an exposure, integrated energy data of the N light pulses preceding the obtaining; and adjusting energy of a light pulse with which said substrate is to be irradiated based on the obtained integrated energy data.

10. An exposure method according to claim 9, wherein said predetermined number is one.

11. An exposure method according to claim 9, wherein said predetermined number is smaller than said integer N.

12. An exposure method according to claim 9, wherein said adjusting comprises adjusting a voltage applied to a Light source for emitting the light pulses.

13. An exposure method according to claim 9, wherein said adjusting is effected based on plural numbers of the obtained integrated energy data.

14. An exposure method according to claim 9, wherein said obtaining is performed during an exposure of a certain shot area, and said adjusting is performed for a shot area to be exposed next.

15. An exposure method according to claim 9, wherein said obtaining and said adjusting are performed during the exposure of a same one shot area.

16. A method for making a scanning exposure apparatus in which a pattern of a first object is transferred onto a second object while moving the first object and the second object synchronously, the method comprising:

providing a light source which emits light pulses for exposing each point on the second Object with N light pulses during scanning exposure (N being an integer);

providing a detecting system which detects energy information of respective light pulses during the scanning exposure, at leapt part of the detecting system being disposed in a path of the light pulses; and providing a calculator which is connected to said detecting system and which, every time a predetermined number of light pulses are emitted, calculates integrated energy data of the N light pulses preceding the calculating, based on the energy information detected by the detecting system.

17. A method according to claim 16, wherein said predetermined number is one.

18. A method according to claim 16, wherein said calculator calculates average energy of light pulses emitted during a scanning exposure, based on the energy information detected by the detecting system.

19. A scanning exposure method wherein an object and a pulsed exposure beam are moved relatively for scanning exposure of the object, comprising:

emitting beam pulses for exposing each point on said object with N beam pulses (N being an integer);

carrying out, every time a predetermined number of beam pulses are emitted during the scanning exposure, a calculation by using energy data of the N beam pulses preceding the carrying out; and adjusting an energy of the pulsed beam with which said object is to be irradiated based on the result of the calculation.

20. A method according to claim 19, wherein said predetermined number is one.

21. A method according to claim 19, wherein said calculation includes calculation of integrated data of the N beam pulses.

22. A method according to claim 19, wherein said operation and said energy adjusting are performed during the scanning exposure of one of a plurality of shot areas on said object.

23. A method according to claim 19, wherein said adjusting is performed every time the pulsed beam is emitted during said scanning exposure.

24. A method according to claim 19, wherein said adjusting includes adjusting a voltage applied to a beam source from which the beam pulses are emitted.

25. A method according to claim 19, wherein said adjusting is performed such that the following condition is met:

$$v=(D/N) \cdot f$$

wherein v: a velocity of movement of said object;

D: a width in the direction of movement of said object, of an area illuminated with said pulsed beam;

f: a frequency of the pulsed beam.

26. A method according to claim 25, wherein intensity distribution in the direction of movement of said object, of the pulsed beam radiated to the object has a slope portion at its edge, and said D is defined by a predetermined intensity level at said slope portion.

27. A method according to claim 26, wherein said predetermined intensity is about half the maximum intensity in said intensity distribution.

28. A method according to claim 19, wherein the following condition is satisfied:

$$N \geq N_{min}$$

wherein $N_{min}$ is the minimum beam pulse number that is required for suppressing an error of integrated exposure dose for said object to a predetermined allowable range.

29. A method for manufacturing a device which uses a method according to claim 19.

30. A method for controlling a laser system which emits pulsed beam for scanning exposure of an object, comprising:

emitting beam pulses, from said laser system, for exposing each point on said object with N beam pulses (N being an integer);

carrying out, every time a predetermined number of beam pulses are emitted during the scanning exposure, a calculation by using energy data of the N beam pulses preceding the carrying out; and adjusting an energy of the pulsed beam to be emitted from said laser system based on the result of calculation.

31. A method according to claim 30, wherein said predetermined number is one.

32. A method according to claim 30, wherein said calculation includes calculation of integrated data of the N beam pulses.

33. A method according to claim 30, wherein said calculation and said energy adjusting are performed during the scanning exposure of one of a plurality of shot areas on said object.

34. A method according to claim 30, wherein said adjusting is performed every time the pulsed beam is emitted from said laser system during said scanning exposure.

35. A method according to claim 30, wherein said adjusting is performed such that the following condition is met:

$$v = (D/N) \cdot f$$

wherein v: a velocity of movement of said object;

D: a width in the direction of movement of said object of an area illuminated with said pulsed beam;

f: a frequency of the pulsed beam.

36. A method according to claim 35, wherein intensity distribution in the direction of movement of said object, of the pulsed beam radiated to the object has a slope portion at its edge, and said D in defined by a predetermined intensity level at said slope portion.

37. A method according to claim 36, wherein said predetermined intensity is about half the maximum intensity in said intensity distribution.

38. A method according to claim 30, wherein the following condition is satisfied:

$$N \geq N_{min}$$

wherein $N_{min}$ is the minimum beam pulse number that in required for suppressing an error of integrated exposure dose for said object to a predetermined allowable range.

* * * * *